US006918429B2

(12) United States Patent
Lin et al.

(10) Patent No.: US 6,918,429 B2
(45) Date of Patent: Jul. 19, 2005

(54) DUAL-LAYER HEAT DISSIPATING STRUCTURE

(75) Inventors: Kuo-Len Lin, Taipei (TW); Hui-Min Tsui, Taipei (TW)

(73) Assignee: Cpumate Inc., Taipei (TW)

( * ) Notice: Subject to any disclaimer, the term of this patent is extended or adjusted under 35 U.S.C. 154(b) by 11 days.

(21) Appl. No.: 10/700,532

(22) Filed: Nov. 5, 2003

(65) Prior Publication Data

US 2005/0092465 A1 May 5, 2005

(51) Int. Cl.[7] .............................. F28D 15/00; F28F 7/00
(52) U.S. Cl. ............................. 165/80.3; 165/104.21; 165/185; 361/700
(58) Field of Search ............................... 165/80.3, 185, 165/104.21, 104.26, 104.33, 67, 76; 361/698, 361/699, 700, 704; 257/714, 715; 174/15.2

(56) References Cited

U.S. PATENT DOCUMENTS

| 5,699,853 A | * | 12/1997 | Goth et al. ............ 165/104.21 |
| 5,959,837 A | * | 9/1999 | Yu ............................. 361/697 |
| 6,189,601 B1 | * | 2/2001 | Goodman et al. ......... 165/80.3 |
| 6,394,175 B1 | * | 5/2002 | Chen et al. ................ 165/80.3 |
| 6,396,693 B1 | * | 5/2002 | Shih ........................... 361/703 |
| 6,651,734 B1 | * | 11/2003 | Liu ............................ 165/80.3 |
| 6,796,373 B1 | * | 9/2004 | Li ......................... 165/104.21 |
| 2003/0019610 A1 | * | 1/2003 | Liu ............................ 165/80.3 |
| 2003/0141041 A1 | * | 7/2003 | Chen ......................... 165/80.3 |
| 2003/0173061 A1 | * | 9/2003 | Lai et al. .................... 165/80.4 |
| 2003/0230398 A1 | * | 12/2003 | Lee et al. .............. 165/104.21 |
| 2004/0226697 A1 | * | 11/2004 | Liu ....................... 165/104.33 |

* cited by examiner

Primary Examiner—Tho v Duong

(57) ABSTRACT

A dual-layer heat dissipating structure includes a first heat sink, a second heat sink, and a heat pipe with a connecting portion and a curved portion, interconnecting the first and second heat sinks for thermal conduction. The first and second heat sinks each has a substrate and exterior fins protruding from two opposing ends thereof. Two substrates each includes at least one slot through out of two corresponding end plates of the same side for locating the connecting portion, and the corresponding end plates each includes an opening with respect to the slot for partially moving in the curved portion. The exterior fins of the first and second heat sinks are aligned with each other, and a snap-type connecting structures are formed on terminuses of the exterior fins. The second and first heat sinks are connected to each other by the snap-type structure, and the connection joint is reinforced by implanting soldering material.

16 Claims, 8 Drawing Sheets

DUAL-LAYER HEAT DISSIPATING STRUCTURE

BACKGROUND OF THE INVENTION

The present invention relates to a dual-layer heat dissipating structure and, more particularly, to a dual-layer heat dissipating structure which employs a heat pipe between two heat sinks, while connection between two heat sinks is reinforced.

The advancement of computer technology has introduced various types of high-precision electronic devices. The improved functions and operation speed of these electronic devices has consequently produced great amount of heat. How to effectively dissipate the heat generated by the electronic devices, and how to maintain the operation temperature of the electronic devices has become an important topic in industry.

FIG. 1 shows a conventional heat dissipating structure 1a. The heat dissipating structure 1a uses a heat pipe 10a serially connecting two heat sinks 11a and 12a. When the lower heat sink 12a is in contact with the heat generating electronic device, a part of the heat is conducted towards the upper heat sink 11a, such that the heat dissipating area is enlarged, and the heat dissipation efficiency is enhanced.

However, in the above heat dissipation structure 1a, the connection of heat sinks 11a and 12a are maintained by the heat pipe 10a only. No adhesive or joining structure is applied in such structure. As the strength of the heat pipe is generally weak, the heat dissipation structure 1a can hardly pass the falling test while an external force is applied thereto.

BRIEF SUMMARY OF THE INVENTION

The present invention provides a dual-layer heat dissipating structure, which comprises two heat sinks connected to each other. Therefore, the heat sinks are integrated into one body, and the jointure is reinforced.

The dual-layer heat dissipating structure includes a first heat sink and a second heat sink aligned with each other, and a heat pipe with a connecting portion and a curved portion for interconnecting the first and second heat sinks.

Wherein each of the first and second heat sink includes a substrate, and two end plates protruding perpendicularly from two opposing ends of the substrate. Two substrates each includes at least one slot through out of two corresponding end plates of the same side for locating the connecting portion, the corresponding end plates each include an opening with respect to the slot for partially moving in the curved portion, and the end plates of the second heat sink are aligned and engaged with the end plates of the first heat sink.

BRIEF DESCRIPTION OF THE DRAWINGS

These, as well as other features of the present invention, will become apparent upon reference to the drawings wherein.

DETAILED DESCRIPTION OF THE INVENTION

Figure 1:
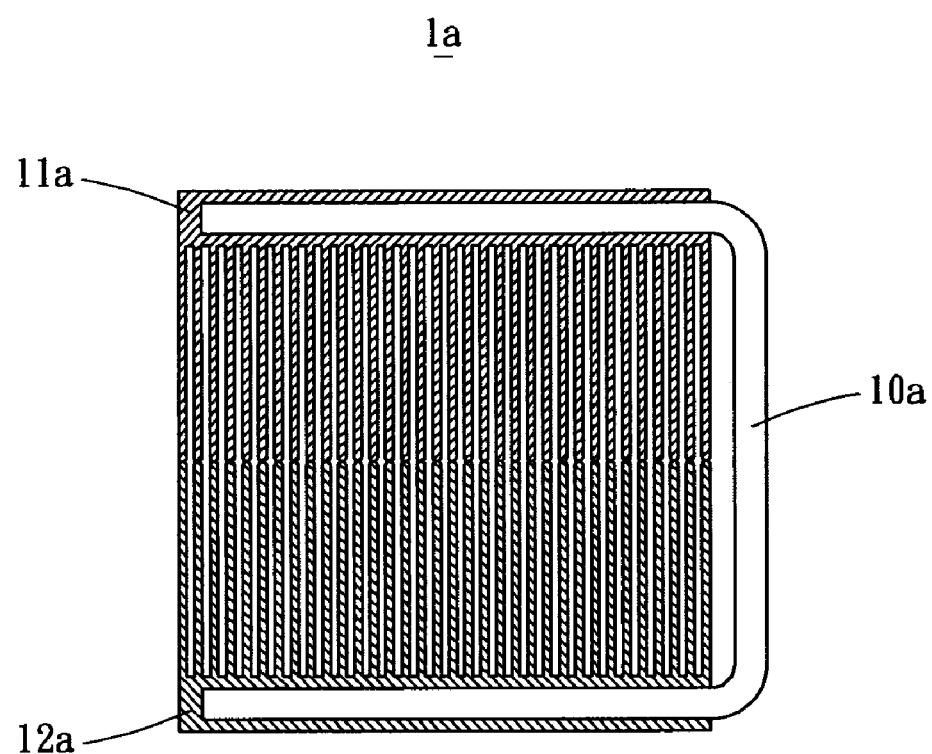
FIG. 1 shows a conventional heat dissipating structure.
Figure 2:
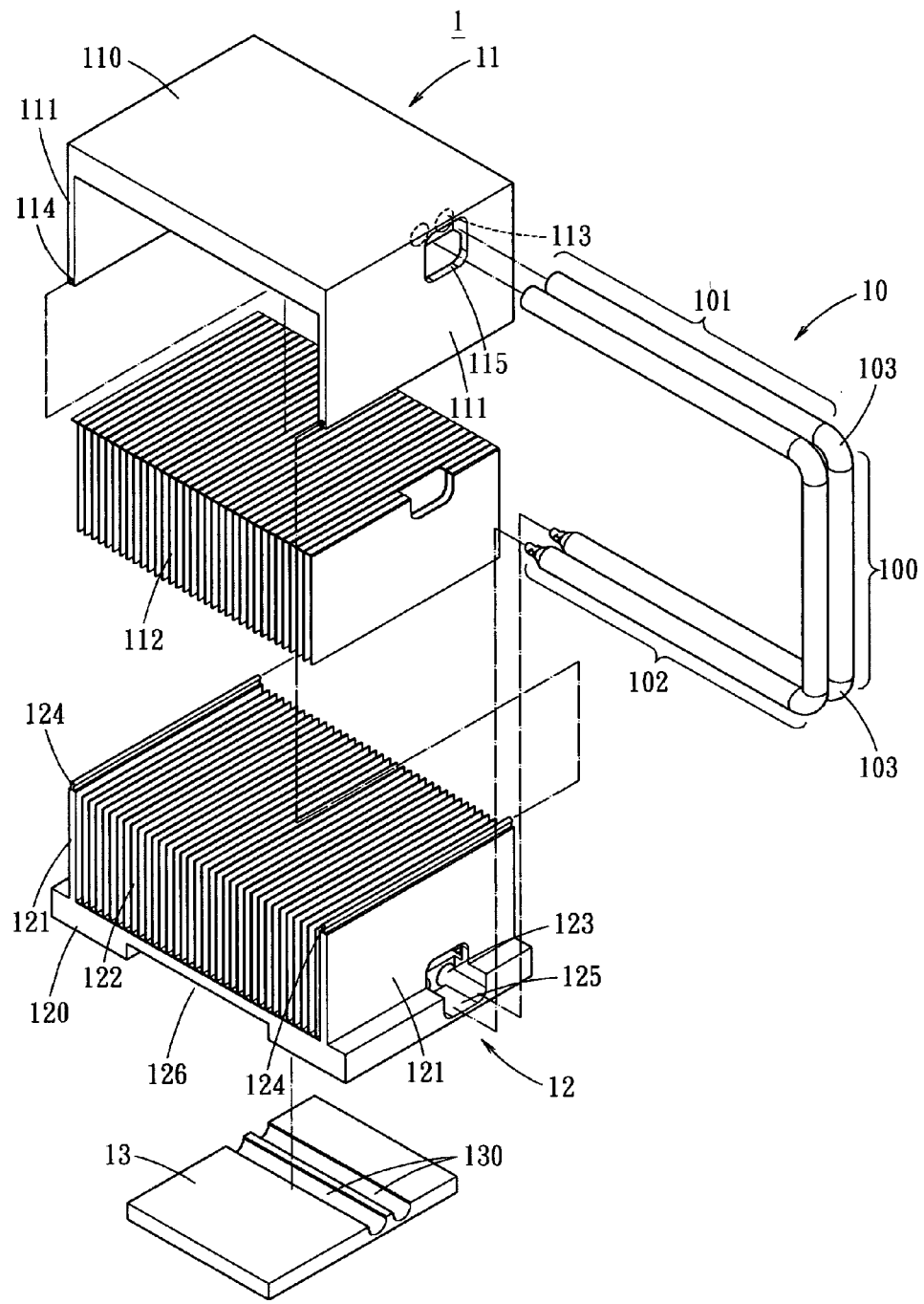
FIG. 2 shows an exploded view of the dual-layer heat dissipating structure provided by the present invention.
Figure 3:
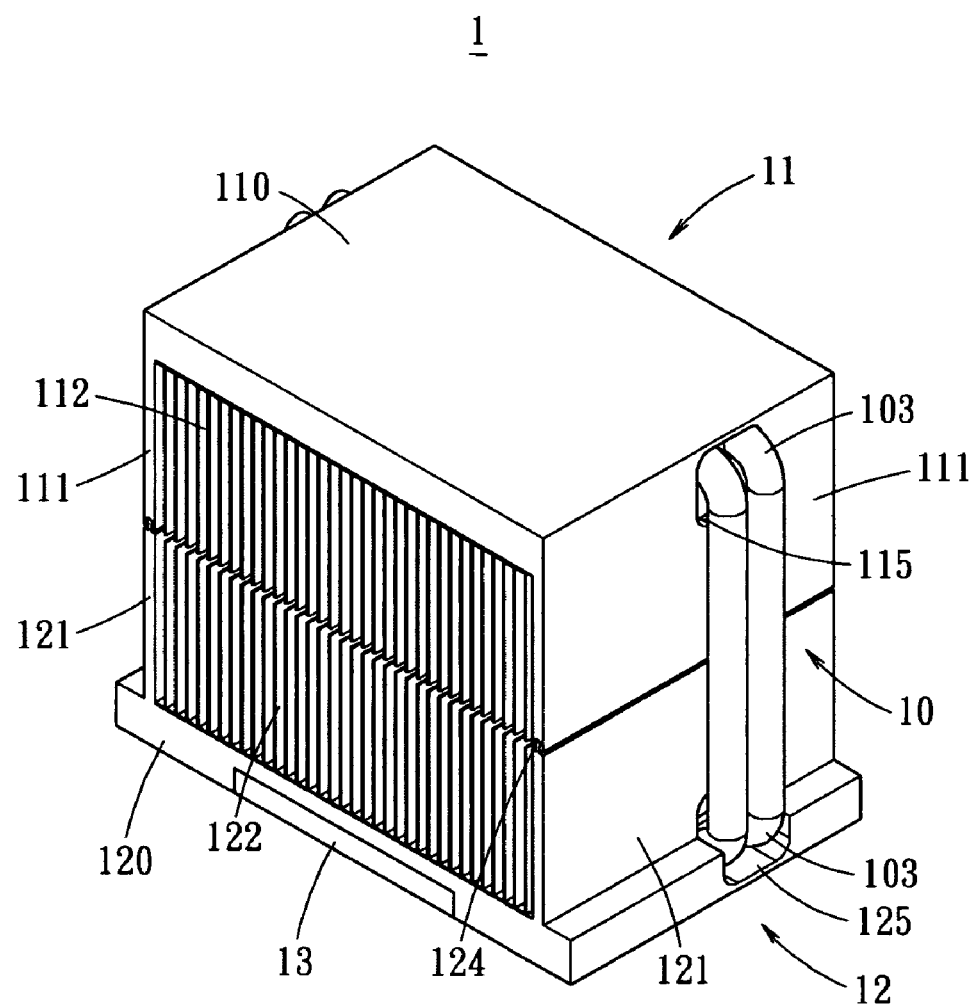
FIG. 3 shows a perspective view of FIG. 2.
Figure 4:
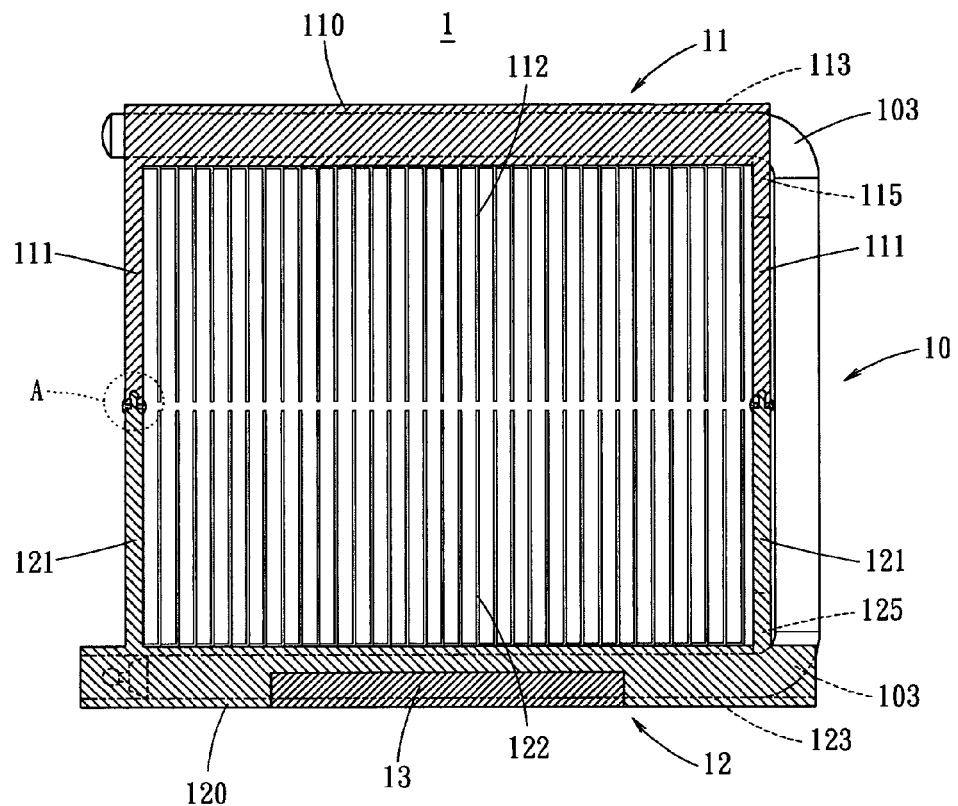
FIG. 4 shows a cross-sectional view of FIG. 3 according to a first preferred embodiment.

FIGS. 2, 3 and 4 show an exploded view, a perspective view and a cross-sectional view of the dual-layer heat dissipating structure provided by the present invention. As shown, the heat dissipating structure includes a first heat sink 11, a second heat sink 12 and at least one heat pipe 10.

The first and second heat sinks 11 and 12 can be made of material with good thermal conductivity such as copper and aluminum. Each of the first and second heat sinks 11 and 12 includes a substrate 110 and 120, a pair of end plates 111 and 121, and a plurality of parallel fins 112 and 122 between the end plates 111 and 121, respectively. In this embodiment, the substrates 11 and 12 have a rectangular shape. The end plates 111 and 112 protrude perpendicularly from two opposing ends of the substrate 110 and 120 and serve as exterior fin, respectively. The fins 112 and 122 protrude perpendicularly from the substrate 110 and 120 between the end plates 111 and 112, respectively. The fins 112 and 122 are permanently connected to the substrate by thermal conductive adhesive or other soldering material such as tin.

A part of the substrate 120 of the second heat sink 12 is recessed to form a receiving slot 126. A thermal conductive block 13 is embedded in the second heat sink 12 at the receiving slot 126. Preferably, the thermal conductive block 13 is fabricated from material with thermal conductivity better than that of the second heat sink 12. Therefore, when the heat sink 12 is fabricated from aluminum, the thermal conductive block 13 can be formed of copper, for example. The thermal conductive block 13 is a planar plate for directly and smoothly attaching to the heat generating electronic device such as the central processing unit (not shown).

The heat pipe 10 includes two parallel horizontal elongate members 101 and 102, interconnected to a vertical elongate member 100 by two curved member 103. The curved member 103 is used as a heat conducting part, while the upper and the lower horizontal elongate member 101 and 102 serve as a heat dissipating part and a heat receiving part, respectively. Preferably, the upper horizontal elongate member 101, the lower horizontal elongate member 102 and the vertical interconnecting member 100 are integrally formed. The upper horizontal elongate member 101 is connected to the first heat sink 11, while the lower horizontal elongate member 102 is connected to the second heat sink 12. One the same side of the substrates 110 and 120, it is formed a slot 113 and 123 through out of one of the end plates 111, 121, allowing the upper and lower horizontal elongate members 101 and 102 to insert through, respectively. Meanwhile, a consecutive slot 130 are formed on the thermal conductive block 13 corresponding the slot 123 of the second heat sink 12, so that the lower horizontal elongate member 102 is located in the slots 123 and 130.

While assembling the first and second heat sinks 11 and 12, the end plates 111 are aligned with the end plates 121, such that the terminuses of each pair of aligned end plates 111 and 121 are brought in contact with each other. The terminuses of each pair of aligned end plates 111 and 121 further comprises a pair of snapping structures, such that the first and second heat sink 11 and 12 can be attached to each other by the snapping structures. Further, soldering material is injected into the joint between the terminuses of the aligned end plates 111 and 121 and cured afterwards. Therefore, the connecting strength of the first and second heat sinks 11 and 12 is reinforced.

Figure 5:
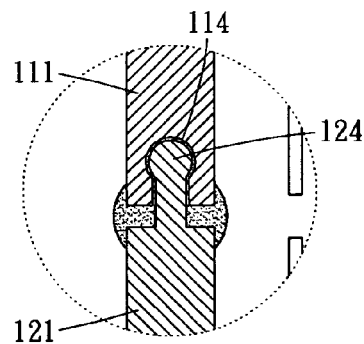
FIG. 5 shows an expanded view of part A of FIG. 4.

As shown in FIGS. 4 and 5, a recessed channel 114 is formed on the terminus of each end plate 111, while a protruding rib 124 is formed on the terminus of each end plate 121. Both the recessed channels 114 and protruding ribs 124 extend through the whole lengths of the terminuses of the end plates 114 and 124, respectively. The protruding ribs 124 can be snapped into the recessed channels 114 and leave a gap between each pair of the end plates 111 and 121. The gap is then filled with soldering material, which is then cured to reinforce the connection between the end plates 111 and 121.

In the above embodiment, the protruding ribs 124 have an oval cross-sectional view.

Furthermore, referring FIGS. 2 to 4 again, due to two horizontal elongated member 101, 102 and the vertical elongated member 100 of the heat pipe 10 cannot have a right-angled connection therebetween. The above-mentioned curved members 103 are then provided. However, the curved member 103 has fixed curvature and curving radian. That is, when the heat pipe 10 is furnished, the vertical elongated member 100 may not move closely to the first and second heat sinks 11 and 12. Therefore, the distance between the vertical elongated member 100 and the heat sinks 11, 12 will increase the bulk structure of the present heat dissipating assembly. As such, by forming an opening 115, 125 corresponding to the hole 113, 23 on the end plate 111, 121 of the heat sink 11, 12, respectively, the curved members 103 can partially move in the openings 115, 125 to shorten the distance between the vertical elongated member 100 and the heat sinks 11, 12, as shown in FIG. 4.

Accordingly, a dual-layer heat dissipating structure is formed.

Figure 6:
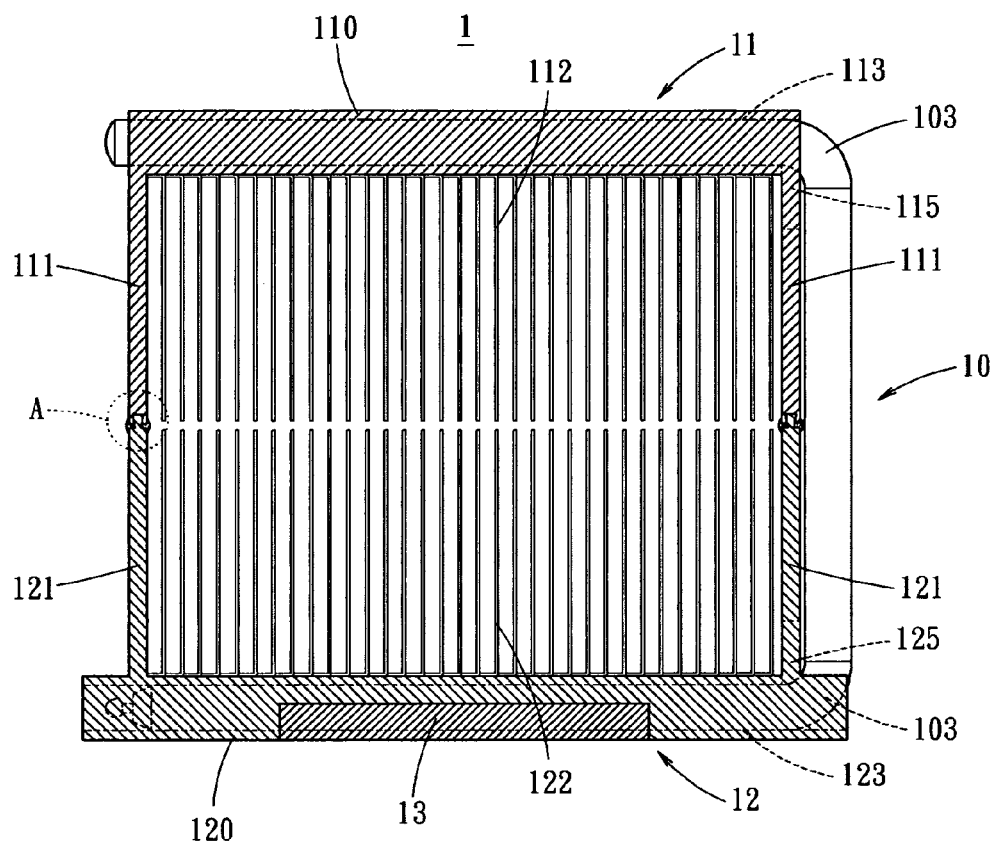
FIG. 6 shows a cross-sectional view of FIG. 3 according to a second preferred embodiment.
Figure 7:
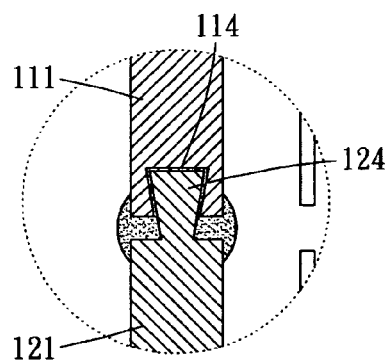
FIG. 7 shows an expanded view of part A of FIG. 6.

FIGS. 6 and 7 show a second embodiment of the present invention. FIG. 6 is a cross-sectional view, while FIG. 7 is an enlarged view of area A as shown in FIG. 6. In this embodiment, the protruding rib 124 has a dovetail cross section, while the recessed channel 114 is configured to conform to the dovetail cross section.

Figure 8:
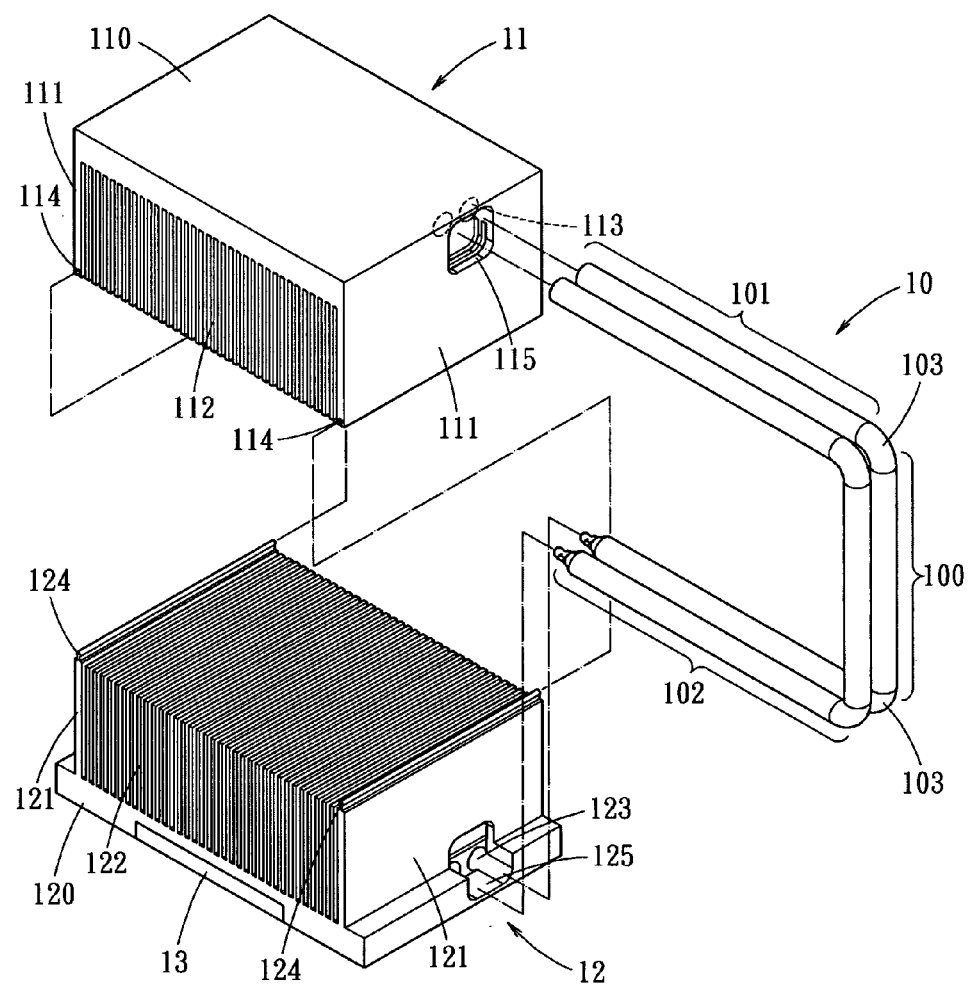
FIG. 8 shows an exploded view of a third preferred embodiment of the present invention.

FIG. 8 shows an exploded view of a third embodiment of the present invention. In this embodiment, the first and second heat sinks 11 and 12 are aluminum extruded heat sinks. That is, each of the fins 112 and 122 is integrally formed on the substrates 110 and 120, respectively.

Figure 9:
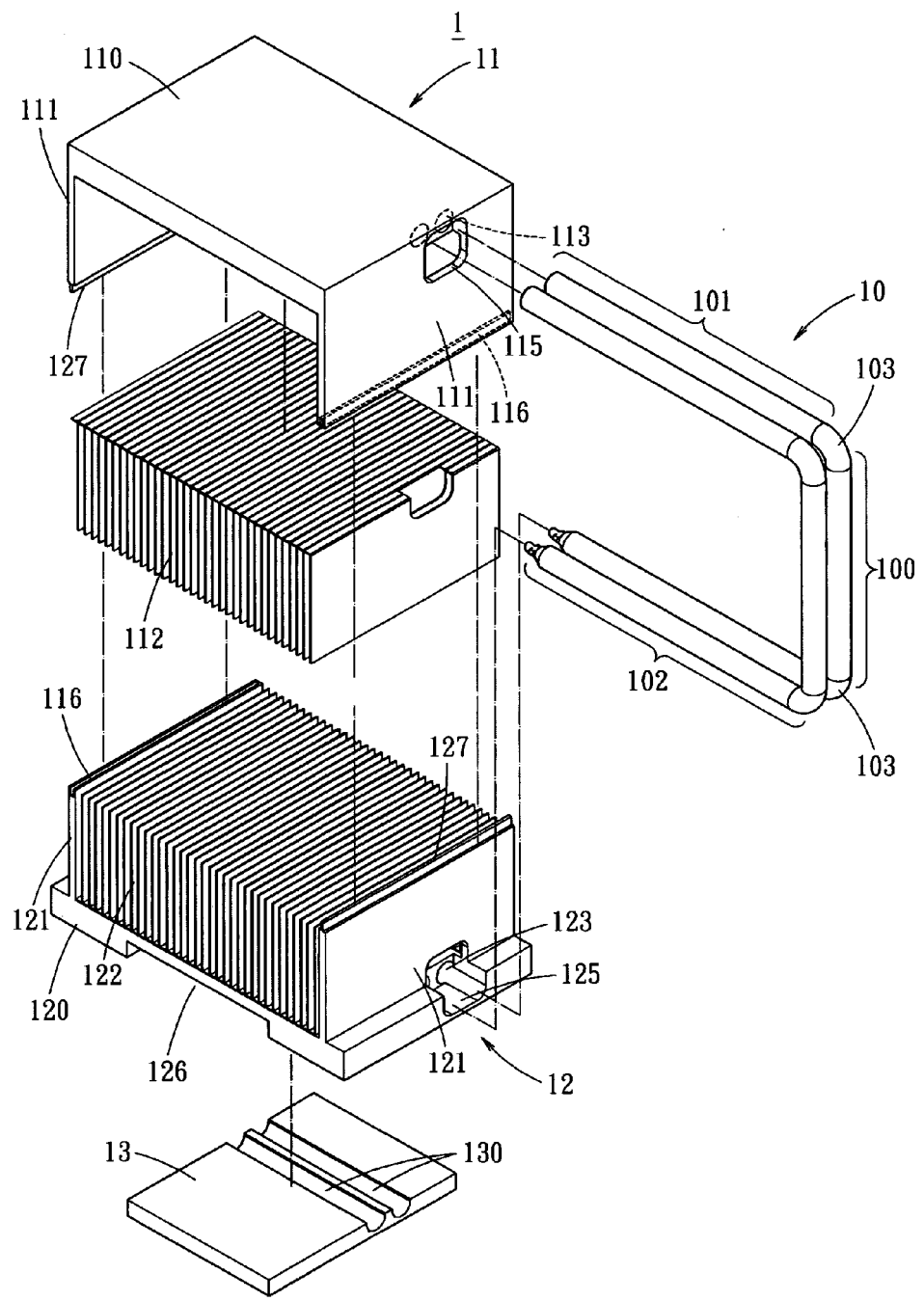
FIG. 9 shows an exploded view of a fourth preferred embodiment of the present invention.
Figure 10:
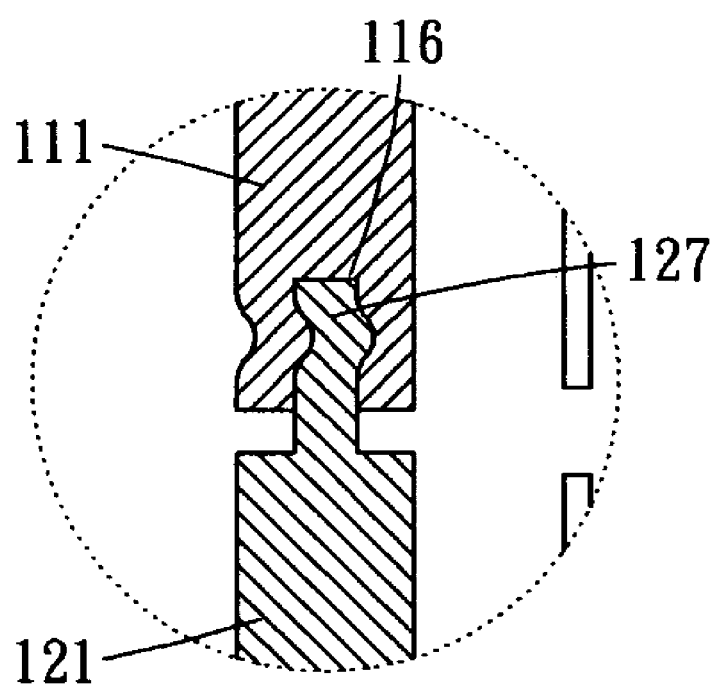
FIG. 10 shows the deformation of the slit and the protrusion of the end plates after pressing.

As shown in FIG. 9, the above-mentioned snapping structure includes a slit 116 and a protrusion 127. The slit 116 and the protrusion 127 are formed on each two corresponding end plates 111, 121 of the heat sinks 11, 12. For example, the first heat sink 11 has the slit 116 and the protrusion 127 formed on each end plate 111, while the second heat sink 12 has the protrusion 127 and the slit 116 formed on the corresponding end plate 121, respectively. Therefore, the heat sinks 11 and 12 may be identical by molding. After the heat sinks 11 and 12 are mounted together, the engagement of the slit 116 and the protrusion 127 thereof are well performed by simply pressing the end plates 111 and 121 to deform the slit 116 and protrusion 127, as shown in FIG. 10.

This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A dual-layer heat dissipating structure, comprising a first heat sink and a second heat sink aligned with each other, and a heat pipe with a connecting portion and a curved portion for interconnecting the first and second heat sinks,
wherein each of the first and second heat sink includes a substrate, two end plates protruding perpendicularly from two opposing ends of the substrate, two substrates each includes at least one slot through out of two corresponding end plates of the same side for locating the connecting portion, the corresponding end plates each include an opening with respect to the slot for partially moving in the curved portion, and the end plates of the second heat sink are aligned and engaged with the end plates of the first heat sink.

2. The heat dissipating structure according to claim 1, wherein the end plates of the first and second heat sinks are engaged with each other by snapping structures formed on terminuses of the end plates.

3. The heat dissipating structure according to claim 1, further comprising a plurality of parallel fins formed between the end plates of the first and second heat sinks.

4. The heat dissipating structure according to claim 3, wherein the second heat the fins are integrally formed with the substrate.

5. The heat dissipating structure according to claim 1, wherein the second heat sink further includes a thermal conductive block having a thermal conducting coefficient larger than the second heat sink.

6. The heat dissipating structure according to claim 5, wherein the substrate of the second heat sink includes a receiving slot to embed the thermal conductive block.

7. The heat dissipating structure according to claim 6, wherein the thermal conductive block includes at least one consecutive slot connecting to the slot of the substrate of the second heat sink.

8. The heat dissipating structure according to claim 1, wherein each end plate of the first heat sink includes a recessed channel and each end plate of the second heat sink includes a protruding rib to be snapped into the recessed channel of the corresponding end plate of the first heat sink.

9. The heat dissipating structure according to claim 8, wherein the protruding rib has a circular cross section.

10. The heat dissipating structure according to claim 8, the protruding rib has a dovetail cross section.

11. The heat dissipating structure according to claim 1, wherein two corresponding end plates of the first heat sink and second heat sinks include a slit and a protrusion, respectively, to be matched together for the engagement.

12. The heat dissipating structure according to claim 11, wherein the engagement is performed by pressing the two corresponding end plates to deform the slit and the protrusion.

13. The heat dissipating structure according to claim 1, wherein the heat pipe includes two horizontal elongate members interconnected to a vertical elongate member by two respective curved members.

14. The heat dissipating structure according to claim 13, wherein one of the horizontal elongate members is inserted through one end plate of the first heat sink as a heat dissipating part, and the other horizontal elongate member is inserted through one end plate of the second heat sink as a heat receiving part.

15. The heat dissipating structure according to claim 13, wherein the horizontal and vertical elongate members are integrally formed.

16. The heat dissipating structure according to claim 1, wherein the engagement between the end plates of the first and second heat sinks is reinforced by soldering material.

* * * * *